(12) United States Patent
Wohl et al.

(10) Patent No.: US 7,958,472 B2
(45) Date of Patent: Jun. 7, 2011

(54) INCREASING SCAN COMPRESSION BY USING X-CHAINS

(75) Inventors: Peter Wohl, Williston, VT (US); John A. Waicukauski, Tualatin, OR (US); Frederic J. Neuveux, Meylan (FR); Yasunari Kanzawa, Sunnyvale, CA (US)

(73) Assignee: Synopsys, Inc., Mountain View, CA (US)

( * ) Notice: Subject to any disclaimer, the term of this patent is extended or adjusted under 35 U.S.C. 154(b) by 332 days.

(21) Appl. No.: 12/242,573

(22) Filed: Sep. 30, 2008

(65) Prior Publication Data

US 2010/0083199 A1  Apr. 1, 2010

(51) Int. Cl.
  *G06F 17/50* (2006.01)
  *G06F 11/22* (2006.01)
  *G01R 31/28* (2006.01)

(52) U.S. Cl. .......... 716/106; 716/136; 714/30; 714/726; 714/733; 714/734; 714/738

(58) Field of Classification Search .................... 714/30, 714/726, 733, 734, 738
See application file for complete search history.

(56) References Cited

U.S. PATENT DOCUMENTS

| | | | |
|---|---|---|---|
| 6,463,561 B1* | 10/2002 | Bhawmik et al. ............. | 714/733 |
| 7,278,123 B2* | 10/2007 | Ravi et al. .......................... | 716/4 |
| 7,284,176 B2* | 10/2007 | Wang et al. .................... | 714/738 |
| 7,302,624 B2* | 11/2007 | Rajski et al. ................... | 714/732 |
| 7,353,470 B2* | 4/2008 | Cooke et al. ...................... | 716/4 |
| 7,412,672 B1* | 8/2008 | Wang et al. ........................ | 716/4 |
| 7,415,678 B2* | 8/2008 | Gizdarski ........................ | 716/1 |
| 7,437,640 B2* | 10/2008 | Rajski et al. ................... | 714/729 |
| 7,509,550 B2* | 3/2009 | Rajski et al. ................... | 714/732 |
| 7,647,540 B2* | 1/2010 | Rajski et al. ................... | 714/738 |
| 7,721,172 B2* | 5/2010 | Wang et al. .................... | 714/729 |
| 7,725,849 B2* | 5/2010 | Abercrombie et al. ........... | 716/4 |
| 7,735,049 B2* | 6/2010 | Wang et al. ..................... | 716/18 |
| 7,823,034 B2* | 10/2010 | Wohl et al. ..................... | 714/726 |
| 7,823,035 B2* | 10/2010 | Litten et al. .................... | 714/729 |
| 7,865,849 B2* | 1/2011 | Butler et al. ................... | 716/136 |
| 2006/0041812 A1* | 2/2006 | Rajski et al. ................... | 714/742 |
| 2006/0041813 A1* | 2/2006 | Rajski et al. ................... | 714/742 |
| 2006/0041814 A1* | 2/2006 | Rajski et al. ................... | 714/742 |
| 2007/0143718 A1* | 6/2007 | Abercrombie et al. ........... | 716/4 |
| 2008/0256497 A1* | 10/2008 | Wohl et al. ........................ | 716/3 |

(Continued)

OTHER PUBLICATIONS

Ferhani et al.: "Classifying Bad Chips and Ordering Test Sets", 2006 IEEE, International Test Conference, Lecture 1.2, pp. 1-10.

(Continued)

*Primary Examiner* — Phallaka Kik
(74) *Attorney, Agent, or Firm* — Bever, Hoffman & Harms, LLP; Jeanette S. Harms

(57) ABSTRACT

To increase scan compression during testing of an IC design, an X-chain method is provided. In this method, a subset of scan cells that are likely to capture an X are identified and then placed on separate X-chains. A configuration and observation modes for an unload selector and/or an unload compressor can be provided. The configuration and observation modes provide a first compression for non-X-chains that is greater than a second compression provided for X-chains. ATPG can be modified based on such configuration and observation modes. This X-chain method can be fully integrated in the design-for-test (DFT) flow, requires no additional user input, and has negligible impact on area and timing. Test generation results on industrial designs demonstrate significantly increased compression, with no loss of coverage, for designs with high X-densities.

16 Claims, 14 Drawing Sheets

U.S. PATENT DOCUMENTS

| | | | | |
|---|---|---|---|---|
| 2008/0294953 | A1* | 11/2008 | Cheng et al. | 714/726 |
| 2009/0177936 | A1* | 7/2009 | Koenemann et al. | 714/737 |
| 2009/0210830 | A1* | 8/2009 | Butler et al. | 716/4 |
| 2009/0249147 | A1* | 10/2009 | Rajski et al. | 714/742 |
| 2010/0017760 | A1* | 1/2010 | Kapur et al. | 716/2 |

OTHER PUBLICATIONS

Wohl et al.: "Fully X-Tolerant Combinational Scan Compression", 2007 IEEE, International Test Conference, Paper 6.1, pp. 1-10.

Sharma et al.: "X-Filter: Filtering Unknowns From Compacted Test Responses", 2005 IEEE, International Test Conference, Paper 42.1, pp. 1-9.

Wohl et al.: "Design Of Compactors for Signature-Analyzers in Built-In Self Test", ITC International Test Conference, 2001 IEEE, Paper 3.1, pp. 54-63.

Mitra et al.: "X-Compact an Efficient Response Compaction Technique for Test Cost Reduction", ITC International Test Conference, 2002 IEEE, Paper 11.2, pp. 311-320.

Mitra et al.: "X-Tolerant Signature Analysis", ITC International Test Conference, 2004 IEEE, Paper 15.1, pp. 432-441.

Keller et al.: "An Economic Analysis And ROI Model For Nanometer Test", ITC International Test Conference, 2004 IEEE, Paper 18.1, pp. 518-524.

Vermeulen et al.: "Trends in Testing Integrated Circuits", ITC International Test Conference, 2004 IEEE, Paper 24.2, pp. 688-697.

Wohl et al.: "X-Tolerant Compression and Application of Scan-ATPG Patterns in a BIST Architecture", ITC International Test Conference, 2003 IEEE, Paper 29.1, pp. 727-736.

Rajski et al.: "Convolutional Compaction of Test Responses", ITC International Test Conference, 2003 IEEE, Paper 29.3, pp. 745-754.

Wohl et al.: "Minimizing the Impact of Scan Compression", Proceedings of the IEEE VLSI Test Symposium, May 2007, 8 pages.

Patel et al.: "Application of Saluja-Karpovsky Compactors to Test Responses With Many Unknowns", Proceedings of the IEEE VLSI Test Symposium, May 2003, 7 pages.

Rajski et al.: "Synthesis of X-Tolerant Convolutional Compactors", Proceedings of the IEEE VLSI Test Symposium, May 2005, 6 pages.

Wohl et al.: "Analysis and Design of Optimal Combinational Compactors", Proceedings of the IEEE VLSI Test Symposium, May 2003, 7 pages.

* cited by examiner

Unload selector generation code 1000

| | |
|---|---|
| 1001 | for each direct-observation unload mode m |
| 1002 |    repeat until all chains connected |
| 1003 |       q=remaining output with fewest chains |
| 1004 |       //X-chains can connect to any output |
| 1005 |       c=remaining chain with fewest outputs |
| 1006 |       connect c to q in mode m |
| 1007 |    end |
| 1008 |    for each output q not yet used in this mode |
| 1009 |       c=non-X-chain not yet used in this mode |
| 1010 |       connect c to q in mode m |
| 1011 |    end |
| 1012 | end |
| 1013 | for each unload mode u until 2controls-1 |
| 1014 |    //create multiple observability mode u |
| 1015 |    select a random subset S of direct observation modes |
| 1016 |    for each mode m in S |
| 1017 |       for each non-X-chain c in m |
| 1018 |          if c not yet connected in mode u |
| 1019 |             connect c to q in mode u |
| 1020 |          endif |
| 1021 |       end |
| 1022 |    end |
| 1023 | end |

FIG. 10

INCREASING SCAN COMPRESSION BY USING X-CHAINS

BACKGROUND OF THE INVENTION

1. Field of the Invention

The present invention relates to the testing of an integrated circuit design and in particular to the efficient compression of the output of such testing.

2. Related Art

Scan is a well-known design-for-test (DFT) technique to control test costs as well as facilitate silicon debug and fault diagnosis for integrated circuits. Notably, as the size and complexity of the designs of these integrated circuits increase, so too do the number and complexity of their corresponding scan test vectors. Indeed, even highly compacted vector sets generated with modern automatic test pattern generation (ATPG) require on-chip compression/decompression to reduce test cost. Combinational scan compression methods are particularly attractive for their simplicity and low overhead in area, timing, and design flow.

Combinational unload compression techniques exploit the low density of error values and can be fault model- and pattern set-independent. The main challenge for unload compressors is to ensure scan cell observation in the presence of unknown (X) values, i.e. values that cannot be accurately predicted by the simulation used during the ATPG process.

These X values can challenge any compression method, in particular deeply sequential compressors. Sequential unload compressors range from limited sequential depth registers to sequentially-controlled combinational data-path compressors. Combinational scan compression methods are particularly attractive for their simplicity and low overhead in area, timing, and design flow. However, these combinational scan compression methods are sensitive to X values.

Recent work that addresses this problem includes compressors that guarantee error detection in the presence of one X value, compressors tolerant of multiple unknown values, ECC-based compressors with special X-filtering hardware, low-area compressors with 2-X tolerance, and fully X-tolerant combinational compressors. An exemplary unload compressor is described in U.S. patent application Ser. No. 11/807,119, entitled, "Scan Compression Circuit And Method Of Design Therefor", which was filed on May 25, 2007 for Synopsys, Inc., and which is incorporated by reference herein.

Unfortunately, compression can be significantly limited due to a high density of X values. For example, a high density of X values can result in the above-described X-masking, which then requires more scan patterns to test desired scan cells. In some cases, this increased number of scan patterns can negate any compression provided by the scan architecture. Therefore, a need arises for a method of increasing compression in IC designs with high X-densities.

SUMMARY OF THE INVENTION

Scan testing and scan compression are key to realizing cost reduction and quality control of ever more complex IC designs. Combinational scan compression methods are particularly attractive for their low impact on area, timing, and design flow. However, the success of such compression methods can be limited if the density of unknown (X) values is high.

In accordance with one aspect of the invention, a method of enhancing combinational scan compression is provided such that significantly higher compression can be obtained on designs with many Xs. This method can include identifying the X-cells of a design, wherein the X-cells are scan cells of the design that have at least a predetermined likelihood of capturing an unknown (X) value. Advantageously, at least one X-chain can be formed, wherein each X-chain is a scan chain including only X-cells. At this point, a configuration and observation modes for at least one of an unload selector and an unload compressor can be provided, wherein the configurations and observation modes provide a first compression for X-chains and a second compression for non-X-chains, and wherein the second compression is greater than the first compression. For example, in one embodiment for a combinational unload selector and compressor, an X-chain is observed only in a direct observation mode, whereas a non-X-chain can be observed in a direct observation mode, a full observability mode, or a multiple observability mode. Automatic test pattern generation (ATPG) can be modified based on at least the configurations and observation modes for the unload selector and the unload compressor.

In one embodiment, identifying the X-cells can include designating all latches and flip-flops of the design as scanable. Clock, set, and reset controllability can then be performed and any latches and flip-flops that fail can be designated as non-scan. Constrained primary inputs of the design can then be set to their constrained values, clocks can be set to off, and scan enable can be set to capture non-shift values. Constant-value state elements of the design can be set to their predetermined binary values. Other primary inputs, non-constant latches, and non-constant flip-flops can be set to random binary values. All other state elements of the design can be set to X. At this point, a predetermined number of random scan patterns can be simulated to determine a frequency that data input of a latch/flip-flop is at X. Any latch/flip-flop whose data input is X with a frequency exceeding a set X-threshold (e.g. 25%) can be designated as an X-cell.

In one embodiment, forming the X-chain(s) can include placing designated X-cells into one chain, sorting the X-cells cells based on X-probability, retaining a predetermined top percentage (e.g. top 5%) of the X-cells based on the sorting, and subdividing the one chain into smaller chains and designating each such smaller chain an X-chain. In one embodiment, sorting the X-cells can also include sorting the X-cells based on location after sorting based on X-probability. Notably, the subdividing can be repeated until each X-chain has a length not exceeding a longest non-X-chain.

In one embodiment, providing the unload selector and the unload compressor can include providing an AND-based unload selector. In this AND-based unload selector, a single AND gate can be provided to receive an output of an X-chain, but first and second AND gates can be provided to each receive an output of a non-X-chain. In this embodiment, an XOR-based unload compressor can be provided. In this XOR-based unload compressor, a single XOR gate can be provided to receive an output of the single AND gate. Additionally, a first XOR gate can be provided to receive an output of the first AND gate, and second and third XOR gates can be provided to receive an output of the second AND gate.

In one embodiment, providing the unload selector and the unload compressor can include designing the unload compressor based on Steiner Triple Systems, wherein a set S of Q elements and a set T of triples of elements from S, such that every pair from S appears in exactly one triple of T. Then, the Steiner Triple Systems can be modified so that only non-X-chains are considered for the set T. The number of scan chains C can be represented by: $C \leq\_Q(Q-1)/6 + C_x$, where Q is a number of scan outputs and $C_x$ is a number of X-chains.

In one embodiment, the unload selector can be designed after designing the unload compressor. The designing of the unload selector can include ensuring that each chain is uniquely observed in at least one direct observation mode and a total number of direct observation modes is as small as possible.

In one embodiment, providing the ATPG can include when, for a shift cycle M, a first observation of a target fault is in a scan cell which is part of an X-chain, the selection of secondary target faults can be narrowed (because shift cycle M requires a direct observability mode for the X-chains). When, for a shift cycle P, a first observation of a target fault is in a scan cell not part of an X-chain, selection of secondary target faults can be narrowed by eliminating all X-chains for shift cycle P because cycle P is likely to not require a direct observation mode.

Advantageously, this X-chain method can be fully integrated in the DFT to ATPG flow, requires no additional user input, and has negligible impact on area and timing. In one embodiment, the above-described X-chain technique can be performed by a programmable processor executing a program of instructions to perform functions of the invention by operating on input scan data and generating output scan data. Test generation results on industrial designs demonstrate significantly increased compression, with no loss of coverage, for designs with high X-densities.

BRIEF DESCRIPTION OF THE FIGURES

FIG. 10 illustrates exemplary unload selector generation code including these three phases.

DETAILED DESCRIPTION OF THE FIGURES

In accordance with improved DFT and ATPG processes, a fully X-tolerant combinational scan compression method designed for minimal impact on design flow, area, and timing is provided. In this method, and described below in detail, X-cells can be identified, grouped into X-chains, and then used in both DFT and ATPG processes.

Figure 1:
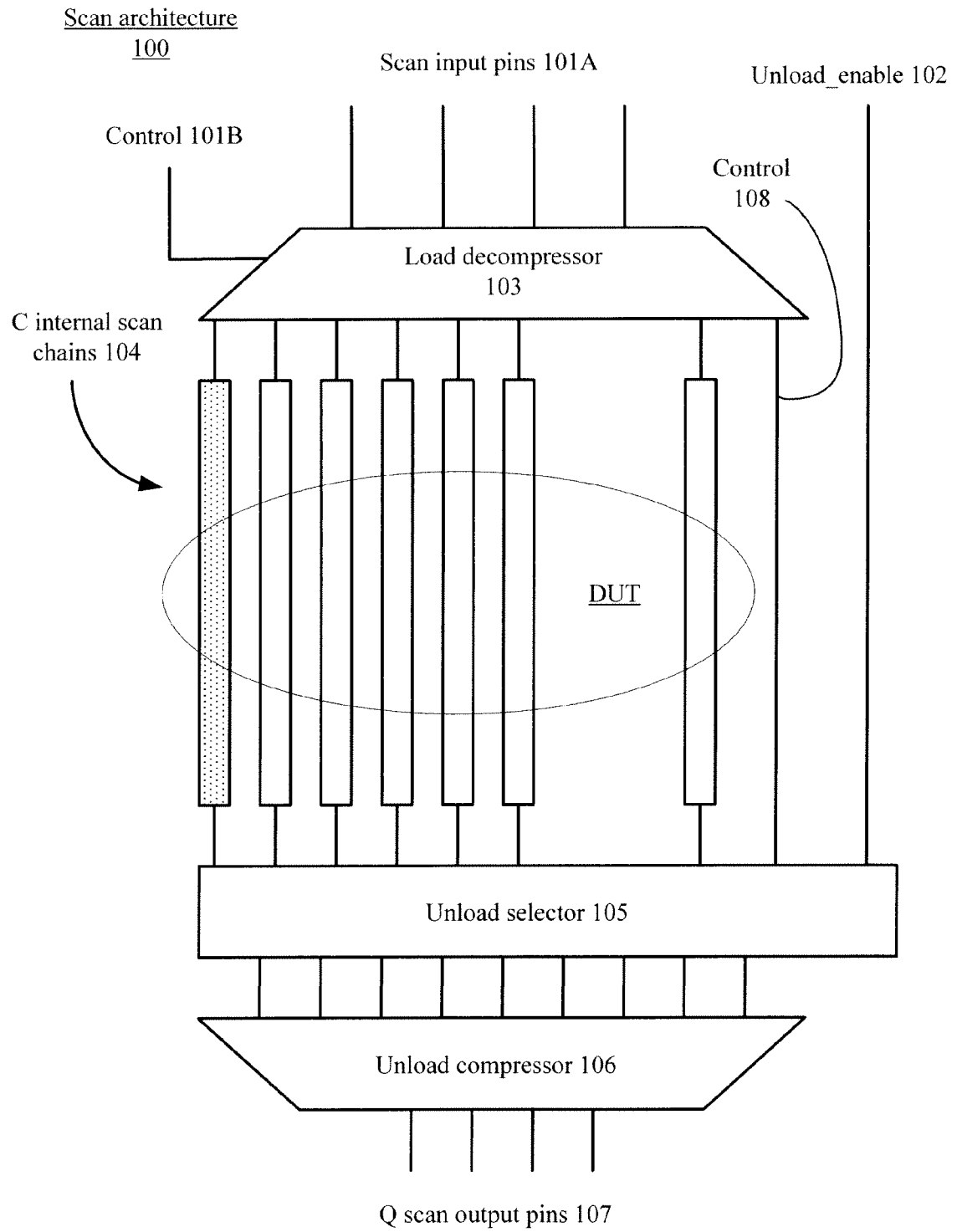
FIG. 1 illustrates an exemplary scan compression architecture.

FIG. 1 illustrates an exemplary scan compression architecture 100. In scan architecture 100, relatively simple circuits can be added to the inputs and outputs of the internal scan chains 104, but the design under test (DUT) remains unchanged. For example in this embodiment, a multiplexer-based load decompressor 103 can receive inputs via scan input pins 101A and a control terminal 101B, and provide care bits to the C internal scan chains 104 as well as control signals to an AND-based unload selector 105. Unload selector 105 receives the outputs of scan chains 104 as well as unload_enable signals 102. In one embodiment, unload compressor 106 XORs selected chain outputs (provided by unload selector 105) to the Q scan output pins 107.

Notably, scan architecture 100 is fully X-tolerant, i.e. it can guarantee observation of any scan cell irrespective of how many other cells have an unknown (X) value. For most shift cycles, unload selector 105 can function transparently. That is, unload selector 105 simply passes through unload values of scan chains 104 with no change. This aptly-named full observability mode is sufficient for shift cycles in which the unknown values, if any, do not mask desired observability.

In this mode, unload compressor 106 (which is based on Steiner Triple Systems) can support up to two Xs per shift with no loss of observability on any other chain. Full observabiity mode is preferred when the number of Xs is small and observabiity is high, even if a few cells are not observed due to X-masking (which refers to the corruption of scan outputs due to Xs in the combinatorial functions used by unload compression 106). High observability advantageously reduces pattern count and improves detection of unmodeled defects.

In contrast, in a direct observation mode, a group of exactly Q scan chains are selected for direct observation (one-to-one) at scan output pins 107. In this mode, unload selector 105 functions as a filter so that unload compressor 106 does not XOR together any of the unload values, thereby ensuring full X-tolerance. In one embodiment, at least $$\left\lceil \frac{C}{Q} \right\rceil$$

direct observation modes can be provided so that every scan chain is directly connected to an output in at least one mode. Therefore, scan architecture 100 ensures no X-masking of the scan cell targeted for fault observation, regardless of how many Xs are in other scan cells. Note that the direct observation mode can advantageously ensure full X-tolerance, but has very low observability (i.e. only Q out of C chains are observed). Therefore, frequent use of direct observation modes can lead to an increase in pattern count.

In a multiple observability mode, a subset of internal scan chains 104 can be observed. In this mode, more than Q scan chains but fewer than C scan chains are each observed at scan output pins 107. Thus, in the multiple observability mode, there are fewer Xs masking fewer outputs. The multiple observability modes can be used when the X-density is not high enough to require a direct observation mode, but is sufficiently high so that most scan cells are X-masked in full observability mode. Note that the full observabiity mode is more sensitive to X-masking because each X fans out to multiple (e.g. three) outputs, but affects only one output in multiple observability modes.

To minimize pattern count, multiple faults must be observable during every unload. Therefore, to ensure observation of targeted scan cells and maximize observabiity of non-targeted cells, the unload selector can choose, on a per-shift basis, from the full observability mode, the direct observation mode, or the multiple observability mode.

In one embodiment of scan architecture 100, the unload_enable signal is a dedicated input for selecting the full observability mode independent of all other inputs. Selection of any other unload mode, i.e. the direct observation mode or the multiple observability mode, requires control signals 108 from load decompressor 103. Note that because the unload of a pattern is overlapped with the load of the next pattern, selecting any non-full observability mode creates competition for the scan input values between load and unload care bits.

High per-shift X-densities can have a negative impact on compression in several ways. For example, increased X-masking results in fewer observed scan cells when using the full observability mode or the multiple observability mode. Additionally, as indicated above, more frequent use of direct observation mode results in lower overall observability. Yet further, more frequent use of the direct observability mode or the multiple observability mode leaves fewer load care bits available, thereby decreasing fault merging ability.

Unfortunately, various factors can contribute to increasing the number of Xs per shift in typical designs. First, typical designs can have an extended usage of RAMs, which are X-sources for basic-scan ATPG. Area and performance considerations often prevent adding DFT structures to block the Xs from propagating to scan cells, thereby increasing the overall number of Xs. Second, aggressive timing of designs can create a large number of false paths that are modeled by masking the values captured in scan cells during test application. This masking can also increase the number of Xs. Third, generation of patterns that pulse multiple clocks to maximize fault detection per pattern can increase Xs. Specifically, because inter-clock domain paths are timed differently, data captured from a different clock domain are masked, thereby creating Xs. Fourth, multiply driven nets (buses) that can have contention or can float can also create X values. Fifth, unmodeled blocks, such as analog or mixed signal, are considered X sources. Sixth, higher compressions require an increased number of internal scan chains, thereby increasing the number of Xs per shift. Seventh, test cost reduction drives down the number of available ATE pins, either through usage of low-cost testers, or by employing multi-site testing. Fewer pins implies that fewer Xs per shift can be tolerated by a combinational compactor before loss of observability occurs.

Notably, with X-chains, architecture 100 can be modified as follows. One or more scan chains, e.g. the left-most scan chain (with a gray fill pattern) of internal scan chains 104 can be configured as X-chains. In this configuration, unload selector 105 and unload compressor 106 can be modified as described below to take advantage of such X-chain(s).

Figure 2:
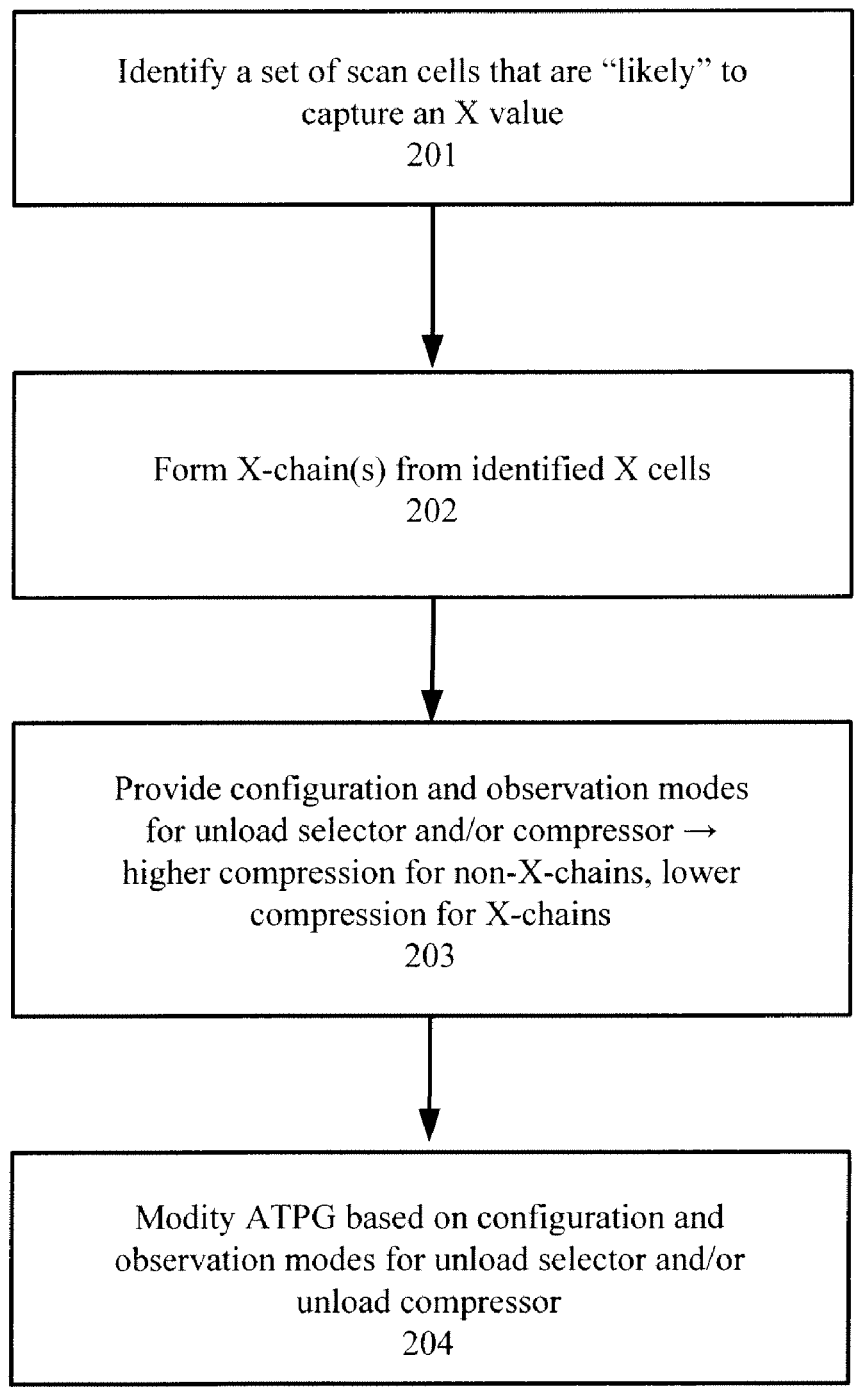
FIG. 2 illustrates a method that can advantageously increase compression for a design with high X-densities.

FIG. 2 illustrates a method 200 that can advantageously increase compression for a design with high X-densities, while preserving the full X-tolerance (thus test coverage) and the low impact on design and flow of the previous methods. In method 200, a small set of scan cells that are "likely" to capture an X value can be identified in step 201. In step 202, this set of scan cells can be stitched into X-chains. The configuration and observation modes of the unload selector and/or the unload compressor can be provided in step 203 so that compression for non-X-chains is greater than for the X-chains. Finally, in step 204, the DFT and ATPG algorithms can be modified based on the configuration and observation modes for the unload selector and the compressor.

Figure 3:
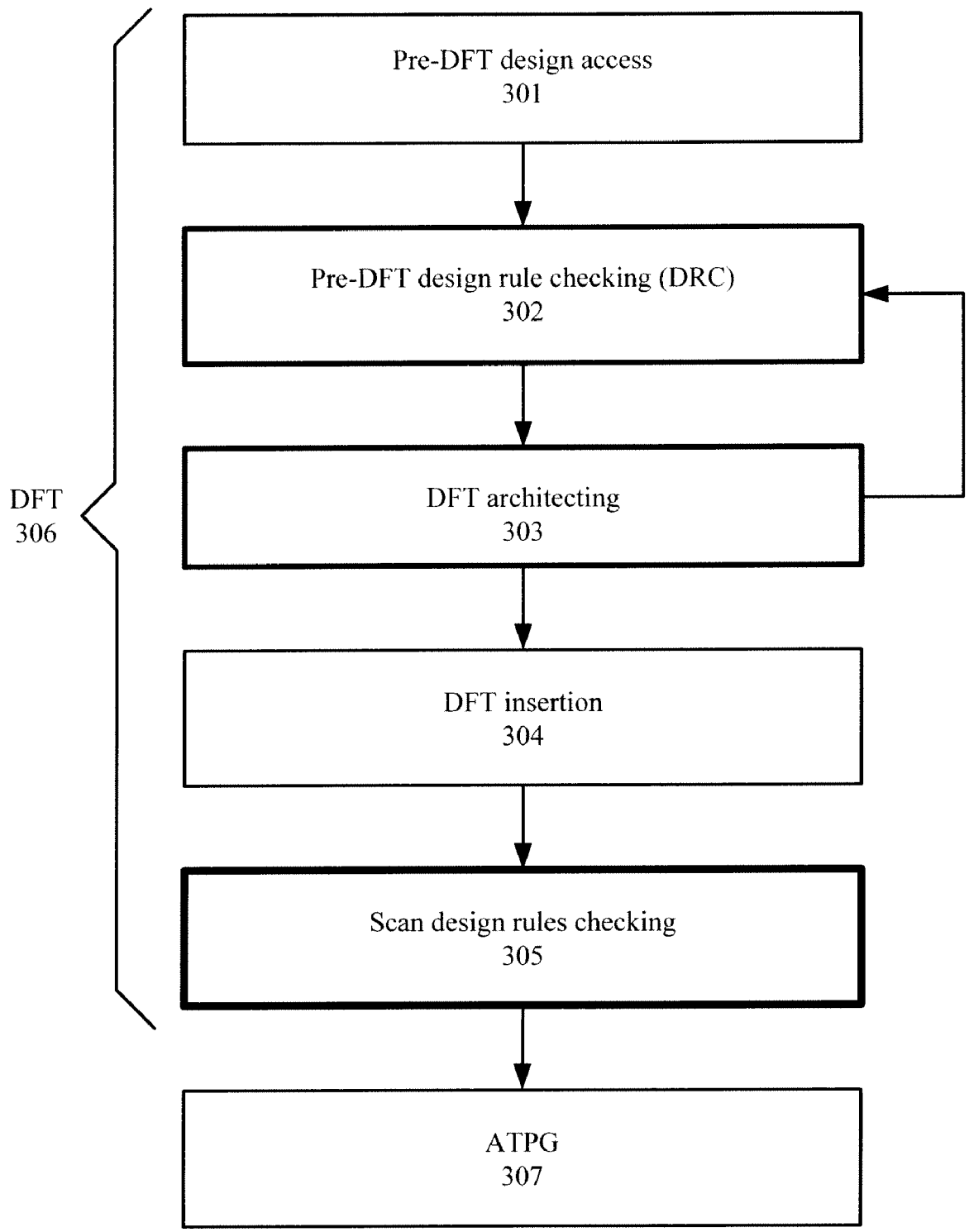
FIG. 3 illustrates a typical DFT to ATPG scan flow that can be modified to take advantage of the method shown in FIG. 2.

FIG. 3 illustrates a typical DFT to ATPG scan flow 300 that can be modified to take advantage of method 200 (FIG. 2). In flow 300, the pre-DFT design can be accessed in step 301. In one embodiment, a user can repeat a pre-DFT design rule checking (DRC) step 302 and a DFT architecting step 303 until the desired scan architecture is obtained.

Figure 4:
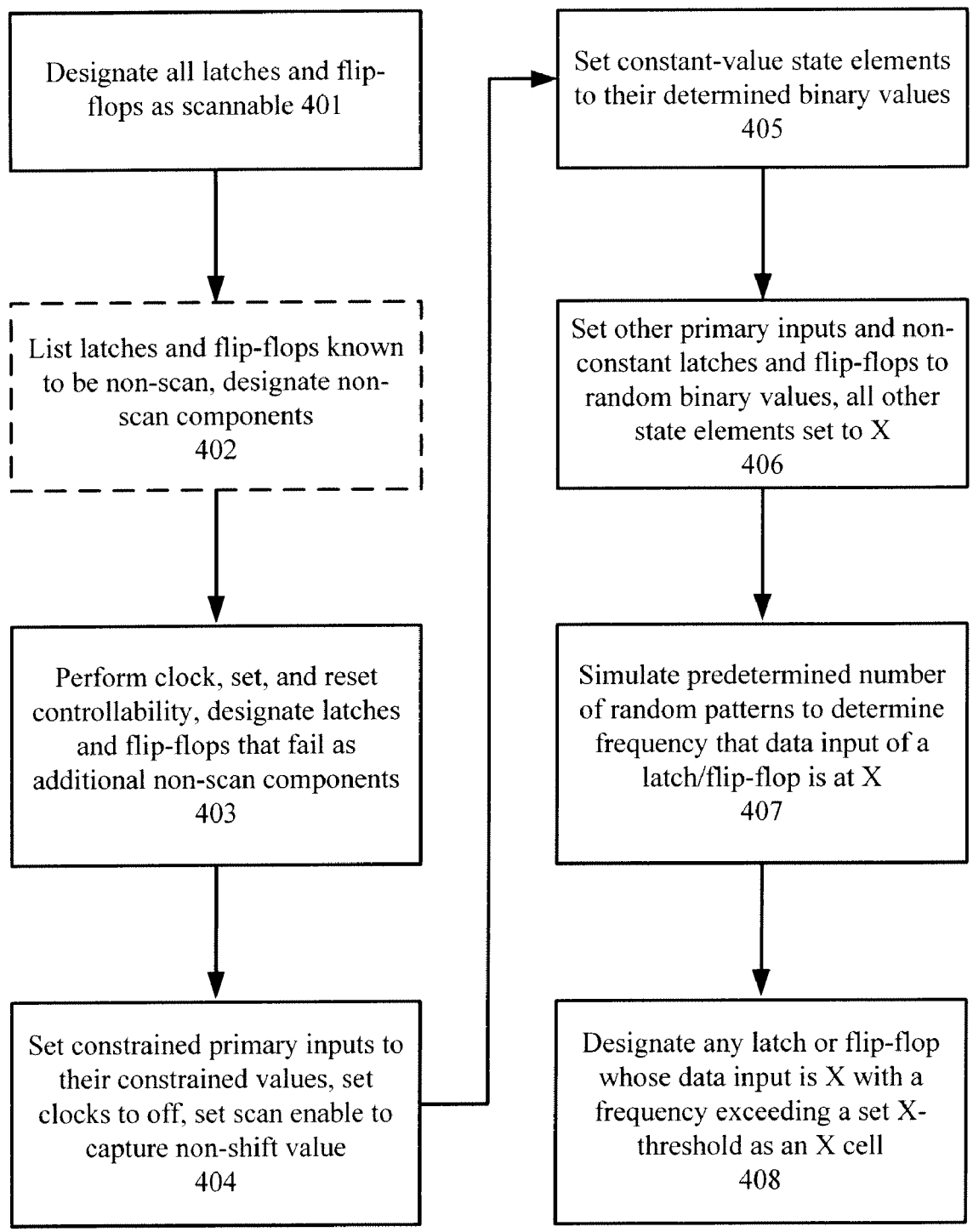
FIG. 4 illustrates an exemplary method 400 to identify cells that capture X values.

In one embodiment, X-cell identification can be performed as part of the pre-DFT DRC step 302. In this manner, X-cells can be identified before scan compression logic configuration and scan chain insertion. FIG. 4 illustrates an exemplary method 400 to identify cells that capture X values. In step 401, all latches and flip-flops are initially considered scanable. In optional step 402, the user may explicitly list latches and flip-flops that are known to be non-scan and known to violate capture setup timing, etc. These latches and flip-flops can be designated non-scan components. Step 403 can perform clock, set, and reset controllability checking. Latches and flip-flops that fail this checking can be designated non-scan components. Thus, steps 401-403 determine the X-cell candidates.

In step 404, any constrained primary inputs can be set to their constrained value, clocks are set off, and scan enable is set to its capture (non-shift, functional) value (as opposed to its scan value). In step 405, constant-value state elements can be set to their determined binary values (i.e. determined in a previous DRC step, which is not shown). In step 406, other primary inputs (i.e. primary inputs other than those listed for steps 403 and 404) and non-constant latches and flip-flops still considered scanable can be set to random binary values. All other state elements (e.g. any non-scan components (latches and flip-flops) designated in step 402) are set to X. Thus, steps 404-406 essentially prepare the design for an X-cell identification simulation to be performed in step 407 by setting initial conditions for that simulation. At this point, in step 407, a predetermined number of random patterns can be simulated to determine the frequency that the data input of a latch or flip-flop is at X. In one embodiment, 1024 random patterns can be simulated. In step 408, a latch or flip-flop whose data input is X with a frequency exceeding a set X-threshold will be recorded, together with its X-frequency, as an X-cell.

In one embodiment, a user may specify this X-threshold value. Note that a value for the X-threshold that is too low can result in too many X-cells and can lead to the isolation of a significant part of the design from the full observability mode. In contrast, a value for the X-threshold that is too high (e.g. 100%) can result in too few X-cells and therefore forfeit X-chain benefits.

Figure 5:
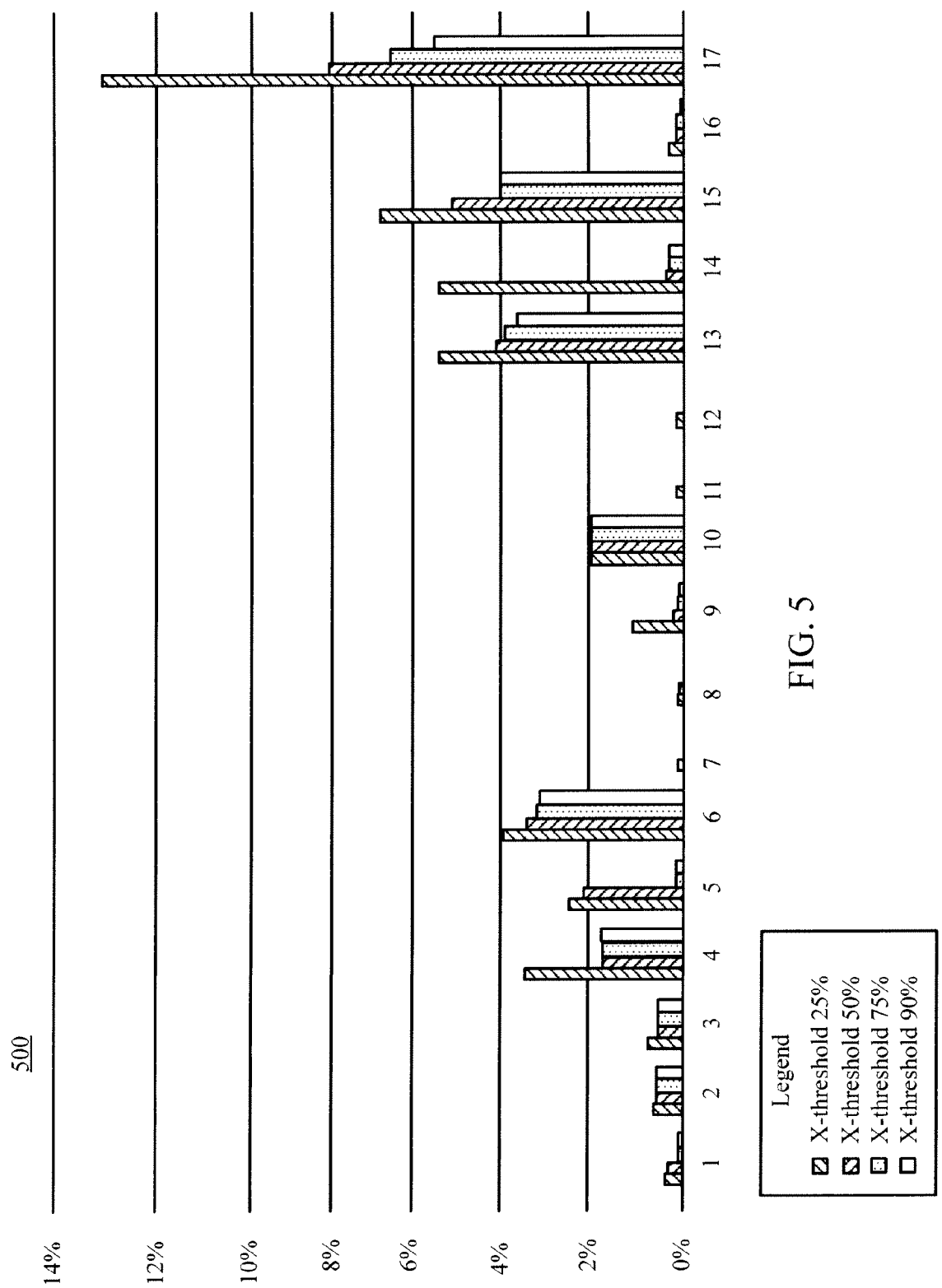
FIG. 5 illustrates a bar chart indicating the percentage of X-cells identified for X-threshold values of 25%, 50%, 75%, and 90% based on data collected for 17 industrial designs.

FIG. 5 illustrates a bar chart 500 indicating the percentage of X-cells identified for X-threshold values of 25%, 50%, 75%, and 90% based on data collected for 17 industrial designs. Note that designs 1, 7, 8, 11, 12, and 16 have no X-cells or very few X-cells. Therefore, the described X-chain technique provides minimal advantages for those designs. However, it is noted that using the X-chain technique for such designs does not worsen results as shown later with the results. As indicated in chart 500, for most other designs, the number of x-cells varies little with the X-threshold value. Indeed, the number of X-cells remains below 5% for most designs. Therefore, in one embodiment, an X-threshold of 25% can be used for more aggressive X-cell identification.

Referring back to FIG. 3, an incorrect classification occurs when an X-cell is not detected at DFT stage 306 (which is described herein as including steps 301-305) and is placed on a regular chain or when a non-X-cell is placed on an X-chain. In either situation, pattern count may increase to ensure observability of all faults. In one embodiment, scan DRC step 305 can be enhanced to check for both of these possible misclassifications by re-calculating X-cells on the final DRC-checked design.

Between DFT stage 306 and ATPG stage 307, several factors can contribute to an incorrect classification. First, the scan enable signal may not be defined before DFT insertion. For correct classification at ATPG stage 307, scan enable must always be defined to pass scan DRC. Second, different models may be used for memories and analog blocks. For this reason, the model used at DFT stage 306 may contain only minimum information, whereas the model used at ATPG stage 307 is a more accurate simulation model. Therefore, for correct classification, the model at ATPG stage 307 should be used. Third, note that the design can be modified during DFT insertion step 304. For correct classification, disabling logic may be used to avoid contention or float contention on tri-state buses. Additionally, uncontrollable clock and reset signals may be bypassed and made controllable. Fourth, the DFT design may use CTL models for high-level representation of certain blocks. Unfortunately, these models do not contain the gate-level information needed to identify X-cells. For correct classification at ATPG stage 307, all models must be available to generate correct patterns. Thus, in general, consistent information throughout DFT to ATPG scan flow 300 is important to maximize the benefit that can be obtained from using X-chains.

The goal of DFT architecting step 303 is to isolate X-cells by allocating them to X-chains without degrading the overall chain balancing. Because the largest scan chain (see FIG. 1, internal scan chains 104) determines the operation of the scan path, an optimized scan architecture 100 uses internal scan chains of similar length. Thus, in one preferred embodiment, any formed X-chains have a length less than or equal to the maximum internal scan chain length.

Figure 6:
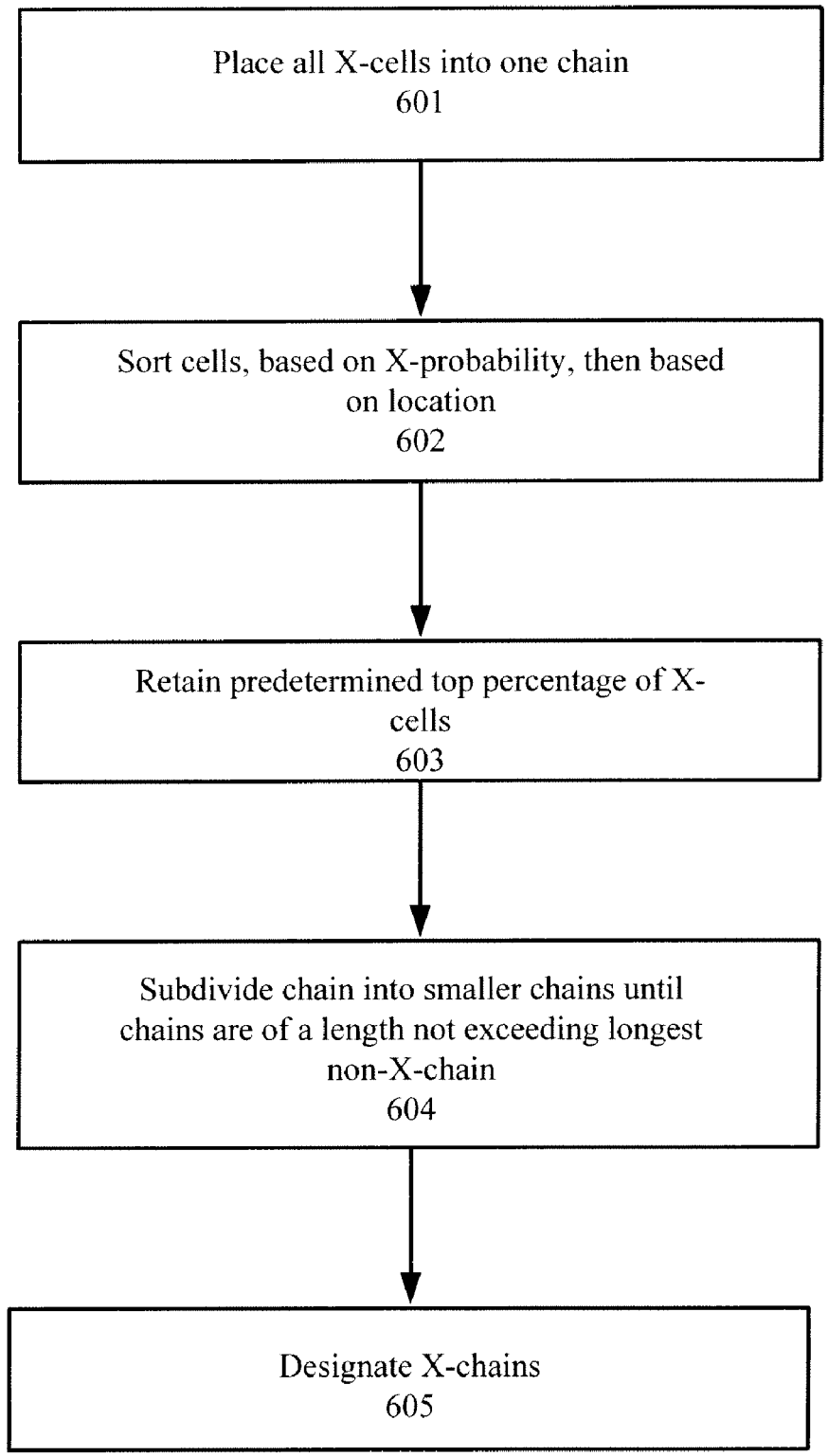
FIG. 6 illustrates an exemplary X-chain formation technique.

FIG. 6 illustrates an exemplary X-chain formation technique 600. In step 601, all X-cells can be placed into one X-chain. In step 602, these X-cells can be sorted based on their X-probability (see step 408, FIG. 4) as well as their location, if physical data is available. Cells with the highest X-probability are placed first in the X-chain. In one embodiment, if a small set of X-cells are very distant from all other X-cells, then that small set of X-cells can be placed near the end of the X-chain in step 601 or may be deleted from the single X-chain of step 601. In one embodiment, only a small percent (e.g. the top 5%) of these X-cells are retained in step 603. (Note that this percentage is particularly useful in cases with very high X-densities to ensure X-chains efficiency.) The rest of the previously-designated X-cells (if any) are considered non-X-cells. Step 604 reduces the X-chain length by subdividing it into smaller X-chain until all X-chains are of a length not exceeding the longest non-X-chain. Step 605 designates the formed X-chains.

Note that even with the formation of X-chains, other scan chains may include X-cells. However, notably, these X-cells are quite minimal and therefore can be dealt with using techniques described in U.S. patent application Ser. No. 11/807, 119, which is incorporated herein by reference in its entirety.

Note that with respect to step 602, prioritizing X-probability over physical location when sorting cells could potentially have an adverse effect on wire congestion induced by scan chain connections. However, in actual industrial designs, this effect is minimal. First, scan cells capturing values from X-sources such as memories, analog blocks, or other black boxes are likely to be located close to one another and location-based ordering is still employed within each cluster of cells. Second, the few wires connecting X-cell clusters will be of equivalent length because each X-cell cluster has, statistically, about the same average X-probability and location-based sorting determines the shortest connections between clusters.

Figure 7A:
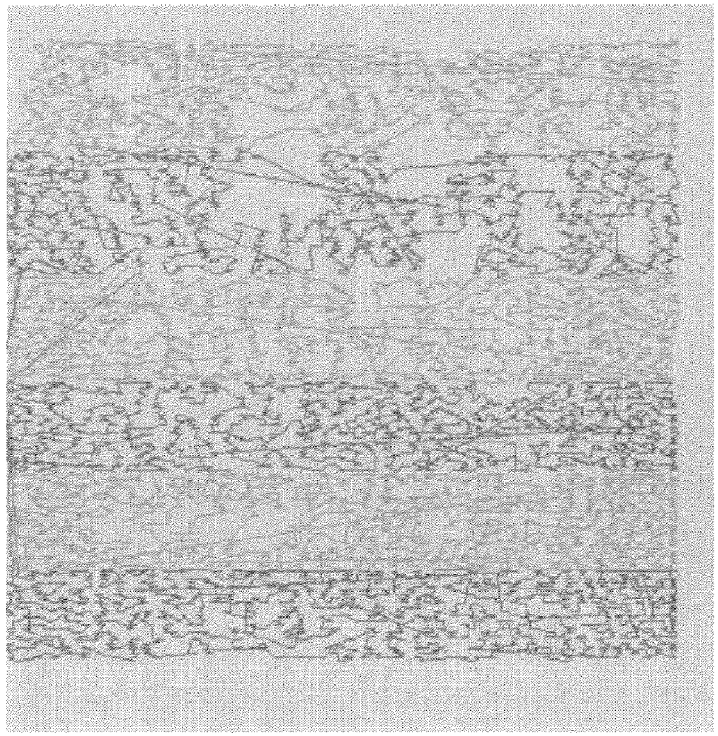
FIG. 7A illustrates a design with six regular scan chains, i.e. one scan chain for each horizontal band of wires.
Figure 7B:
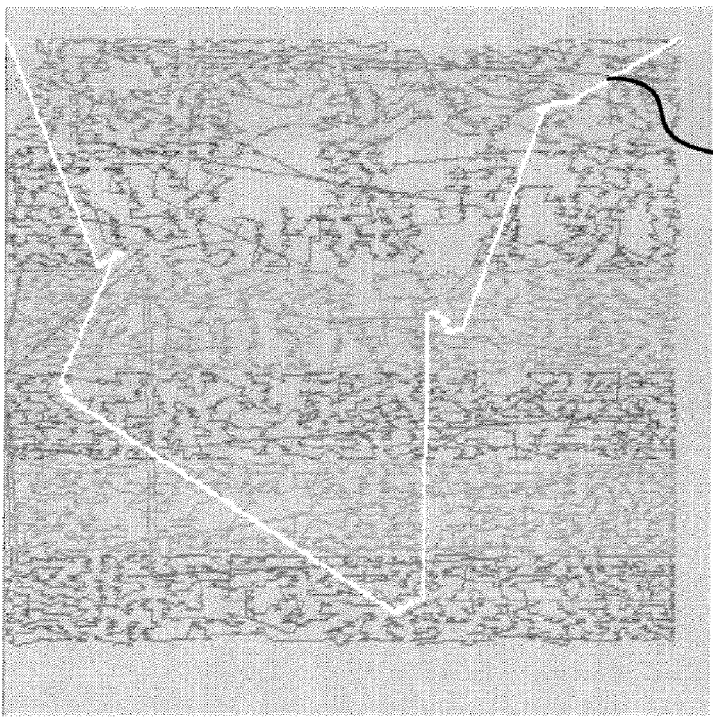
FIG. 7B illustrates the same design with multiple scan chains as well as one X-chain.

FIG. 7A illustrates a design with six regular scan chains, i.e. one scan chain for each horizontal band of wires (i.e. bands 701-706). FIG. 7B illustrates the same design with multiple scan chains as well as one X-chain 711 (shown as a white line). Note that in general, most scan cells are allocated to scan chains based on their position on the Y (vertical) axis. In contrast, X-chain 711 includes X-cells located in each of the six bands 701-706. As shown in FIG. 7B (and empirically confirmed with industrial designs), the few long wires linking the X-cells to form the X-chain are not significantly longer than some of the intra-band wires.

Figure 8:
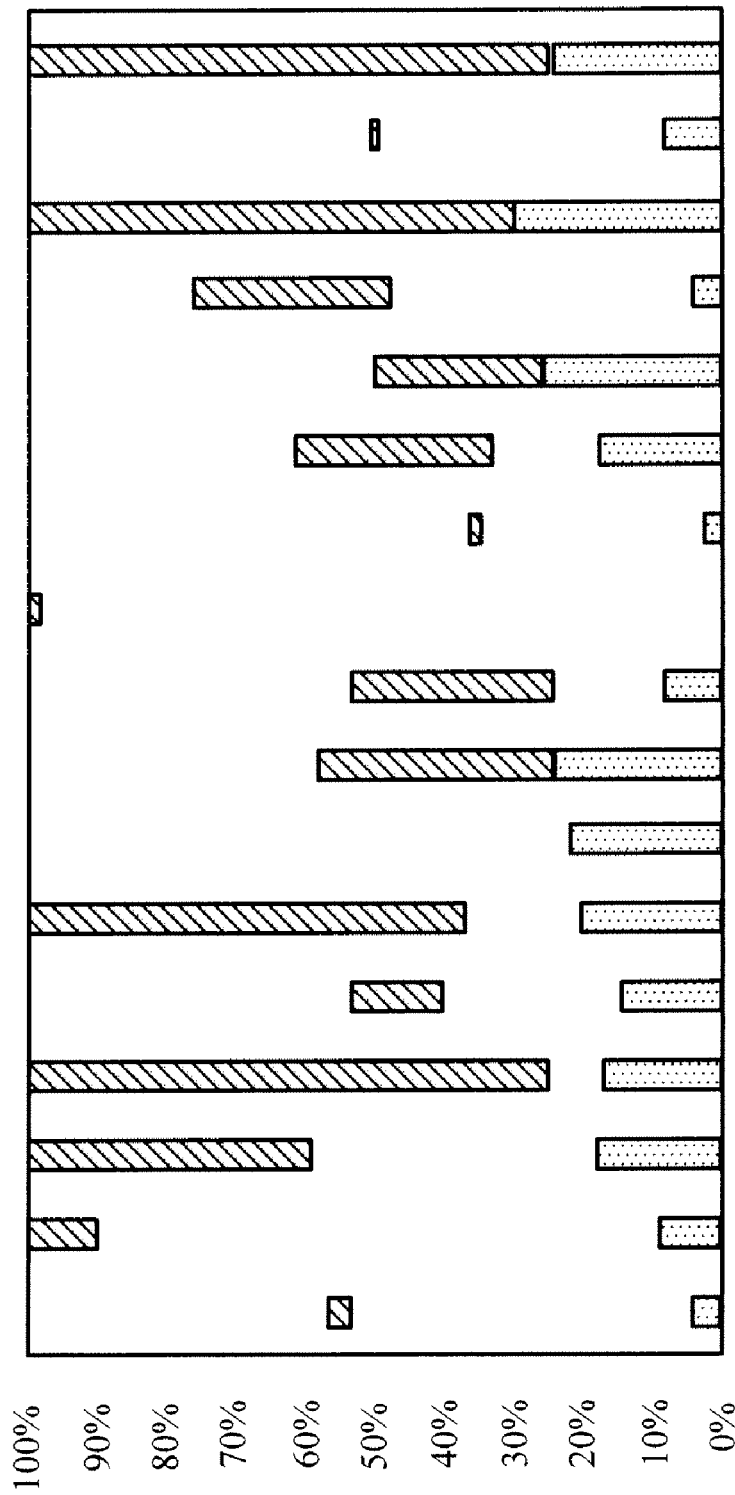
FIG. 8 illustrates a bar chart indicating a range of X-probability for X-chains and non-X-chains for 17 exemplary industrial designs.

To quantify how accurately X-chains isolate X-cells from other cells, the "X-probability" of each scan chain can be computed as the average probability of capturing an X in any of its cells. Ideally, X-chains would have an X-probability close to 100%, and other chains would have an X-probability close to 0. FIG. 8 illustrates a bar chart 800 indicating a range of X-probability for X-chains and non-X-chains for 17 exemplary industrial designs. For example, design 1 has non-X-chain probabilities in the range of 0-4% and X-chain probabilities in the range of 53%-56% and shows good isolation. Design 2 is close to ideal, i.e. non-X-chain probabilities in the range of 0-9% and X-chain probabilities in the range of 90%-100%. Design 10 achieves the ideal, i.e. all non-X-chains have 0% X-probability and all X-chains have 100% (that is, the scan cells either capture Xs all the time or never capture an X). In contrast, designs 8, 13, 15, and 17 have virtually no isolation between ranges. Note that design 13 is particularly challenging because X-chain and non-X-chain ranges are quite narrow and have no separation. Further note that design 7 has no X-chains and therefore has no X-cells.

Figure 9:
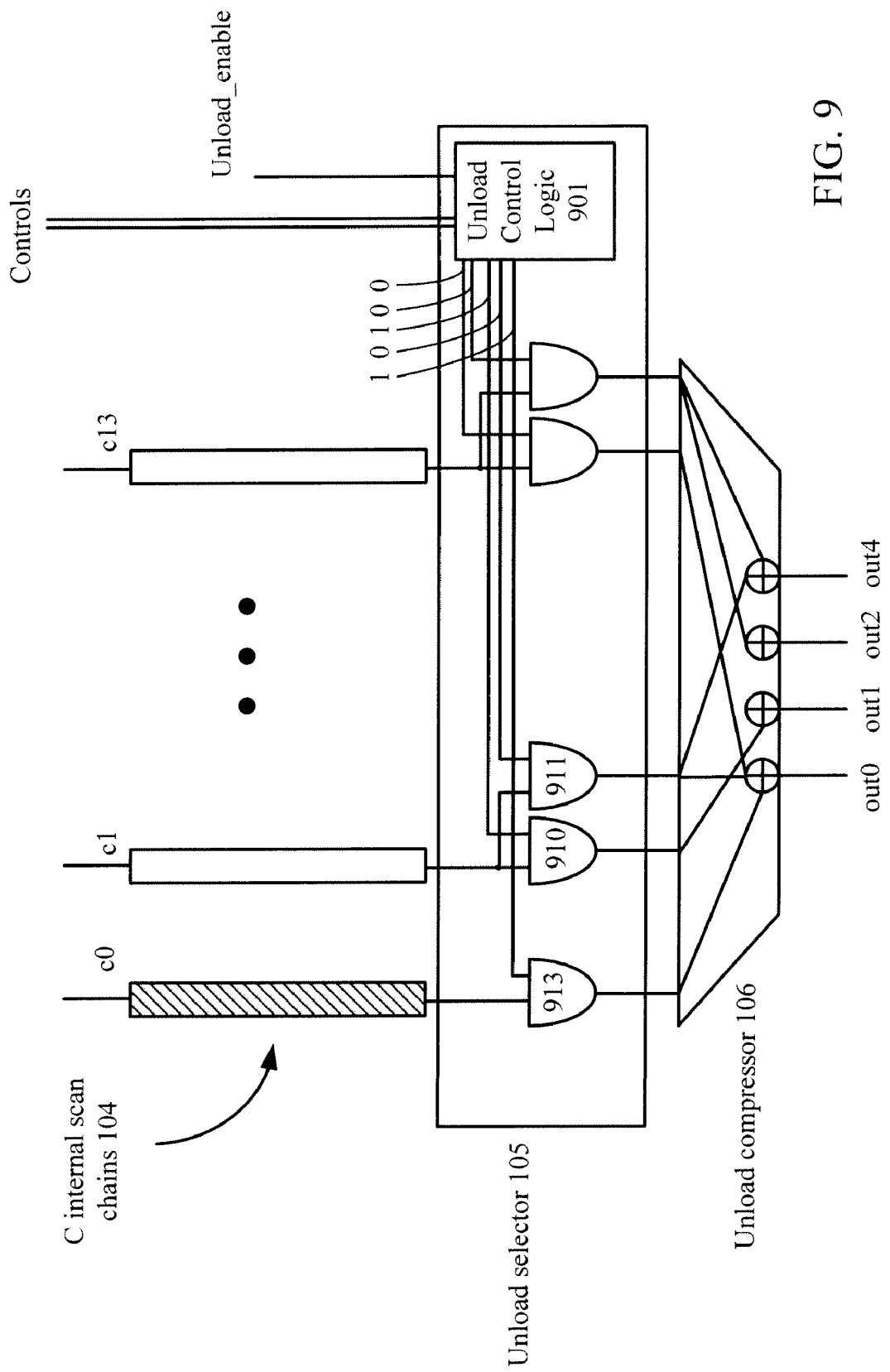
FIG. 9 illustrates an exemplary embodiment of an unload selector and an unload compressor in a combinational implementation.

To optimize the X-chain technique, a configuration and observation modes for the unload selector and/or unload compressor can provide a first compression for non-X-chains that is greater than a second compression provided for X-chains. FIG. 9 illustrates an exemplary embodiment of unload selector 105 and unload compressor 106 in a combinational implementation. Note that other configurations of an unload selector and an unload compressor, a combined unload selector/compressor, or an unload compressor (without a selector) may be used in other embodiment and can also used different compressions for X-chains and non-X-chains. In this embodiment, unload selector 105 can be implemented with a single AND gate per X-chain (shown as the scan chain c0 with a fill pattern) and two AND gates per non-X-chain (shown as the scan chains c1 . . . c13 without a fill pattern). For each non-X-chain, one AND gate (e.g. AND gate 910) can block a direct path from the scan chain output to an output pin, and the other AND gate (e.g. AND gate 911) can block the remaining fanout.

In FIG. 9, scan chain c0 connects (via XOR unload compressor 106) to output out0, and scan chain c1 connects to out0, out1, and out3. In full observability mode, the five outputs of unload control logic 901 are (top-down) 1, 1, 1, 1, 0, thereby ensuring that all AND gates are "on" (i.e. passing values of internal scan chains 104) except AND gate 913 of scan chain c0. In the direct observation mode shown, the five signals from unload control logic 901 are (top-down) 0, 0, 1, 0, 1 (shown in FIG. 9), thereby ensuring that only AND gates 911 and 913 are on.

In this configuration, scan chain c0 is uniquely connected to out0, and scan chain c1 is uniquely connected to out1 (note that other scan chains, not shown, can be uniquely connected to out2 and out3). Moreover, in this configuration, scan chain c13 is not observed at any output because both of its AND gates are "off" (i.e. forced to a logic zero regardless of the output of chain c13). In contrast, if the five signals from unload control logic 901 are (top down) 1, 0, 0, 0, 0, then scan chain c13 is observed at out0, while scan chains c0 and c1 are not observed.

In a multiple observability mode, the five signals from unload control 901 could be (top down) 1, 0, 0, 1, 0, thereby connecting scan chain c13 to out0, and scan chain c1 to outi (possibly XORed with other scan chains, not shown).

Thus, in this embodiment, unload selector 105 and unload compressor 106 can be designed so that each scan chain can be uniquely observed (i.e. no XOR) during at least one direct observation mode. More specifically, X-chains can be observed using only the direct observation mode, whereas non-X-chains can be observed using one of the direct observation mode, a full observability mode, and multiple observability mode.

In one embodiment, unload selector 105 can be designed after unload compressor 106 to ensure optimized full observability in the presence of unknown values, which can provide better scan efficiencies than either the direct observation mode or the multiple observation mode. In one embodiment, the design of unload compressor 106 can be based on Steiner Triple Systems (i.e. a set S of Q elements together with a set T of triples of elements from S, such that every pair from S appears in exactly one triple of T). Steiner Triple Systems, which are known to those skilled in the art of scan, are discussed in U.S. patent application Ser. No. 11/807,119, which is incorporated by reference herein. In unload compressor 106, S is the set of the Q scan outputs. Each internal scan chain 104 connects to 3 outputs, so T is the set of all output triples scan chains connect to. The requirement for a Steiner Triple System can then be stated as no two scan chains connect to the same pair of two outputs. Therefore, no two scan chains having an unknown (X) value at the same unload cycle can mask all outputs for a non-X chain. When a Steiner Triple System exists, the number of chains C is limited by: $C \leq Q(Q-1)/6$.

In accordance with one aspect of U.S. patent application Ser. No. 11/807,119, not all output pairs must be used in some chains, i.e. incomplete and imprecise sets of triples are allowed. Herein, the above algorithm can be further modified so that only non-X-chains are considered for set T. This consideration relaxes the search for a suitable unload compressor because the number of scan chains that must meet the Steiner Triple System restriction is reduced by the number of X-chains, $C_x$, so:

$$C \leq Q(Q-1)/6 + C_x.$$

At this point, unload selector 105 can be designed based on the existing unload compressor so that each scan chain can be uniquely observed in at least one direct observation mode, and the total number of direct observation modes is as small as possible.

The design process for unload selector 105 has three phases, wherein each phase assigns scan chains to outputs in a direct or multiple observation mode. FIG. 10 illustrates exemplary unload selector generation code 1000 including these three phases. In code 1000, lines 1001-1007 (phase 1) can create enough direct observation modes to ensure that each scan chain can be uniquely observed. Lines 1008-1011 (phase 2) can complete the last direct observation mode. Lines 1013-1023 (phase 3) can create multiple observabiity modes. Notably, X-chains can be connected to any output in a direct observation mode, so preference is given to a scan chain with the fewest output connections (line 1005). To minimize hardware overhead of the unload selector, scan chain c (lines 1005 and 1009) is chosen from the scan chains that already connect to output q in a full observability mode.

TABLE 1

| | Unload selector configuration | | | | |
|---|---|---|---|---|---|
| Output pins | Unload_enable = 0 Full obs. | Unload_enable = 1 Mode 0 | Unload_enable = 1 Mode 1 | Unload_enable = 1 Mode 2 | Unload_enable = 1 Mode 3 (0 + 1 + 2) |
| 0 | 1, 3, 6, 8, 9 | 3 | 6 | 9 | 3, 9 |
| 1 | 1, 4, 7, 8 | 4 | 1 | 0 | 4 |
| 2 | 1, 5, 7, 9 | 5 | 7 | 1 | 1, 5, 7 |
| 3 | 2, 6, 7, 8, 9 | 2 | 8 | 6 | 2, 6, 8 |

For example, referring to Table 1 (shown above), 10 scan chains (0, 1, . . . , 9) are connected to 4 outputs (0, 1, 2, 3) so that in full observability mode, scan chains 1, 3, 6, 8, 9 are XORed to output pin 0; scan chains 1, 4, 7, 8 are XORed to output pin 1; scan chains 1, 5, 7, 9 are XORed to output pin 2; and scan chains 2,6,7,8,9 are XORed to output pin 3. (In this example, scan chain 0 is an X-chain and therefore is not part of the full observability mode.) To exploit the minimal hardware implementation shown in FIG. 9, each direct observation mode (mode 0, 1, or 2) selects, for each output pin, one of the scan chains already connected to the output pin in full observability mode. In one embodiment, each direct observation mode can select 4 unique chains so 10/4=2.5, i.e. 3 modes, should suffice to observe all scan chains.

Note that in some cases, the unload compressor may be such that C chains cannot be directly and uniquely observed at Q outputs in only $$\left\lceil \frac{C}{Q} \right\rceil$$

modes. Moreover, an algorithm that would guarantee the minimal number of modes for any unload compressor could be prohibitively slow. Fortunately, unload selector generator code 1000 can produce optimized results with negligible run-time. For example, code 1000 can first assign scan chains 4, 5, 3, 2 to output pins 1, 2, 0, 3 in mode 0 (Table 1). Next, scan chains 1, 7, 6, 8 can be assigned to output pins 1, 2, 0, 3 in mode 1. Finally, X-chain 0 and scan chain 9 can be assigned to output pins 1 and 0 in mode 2. Thus, only 3 modes suffice to directly observe all scan chains. Output pins 2 and 3 are not yet used in mode 2, so they are assigned scan chains 1 and 6, respectively (lines 1008 to 1012). Because 3 modes require 2 controls to select, there is one more available mode, so one last mode, mode 3, can be created by assigning the non-X-chains of modes 0, 1, and 2 (lines 1013 to 1023 FIG. 8).

Note that the control signals 108 (FIG. 1), which are generated by load decompressor 103, can be generated by a conventional heuristic. However, in contrast to a conventional heuristic, all outputs of all modes can be fully utilized (see, lines 1008 to 1023 of code 1000 in FIG. 10).

Figure 11:
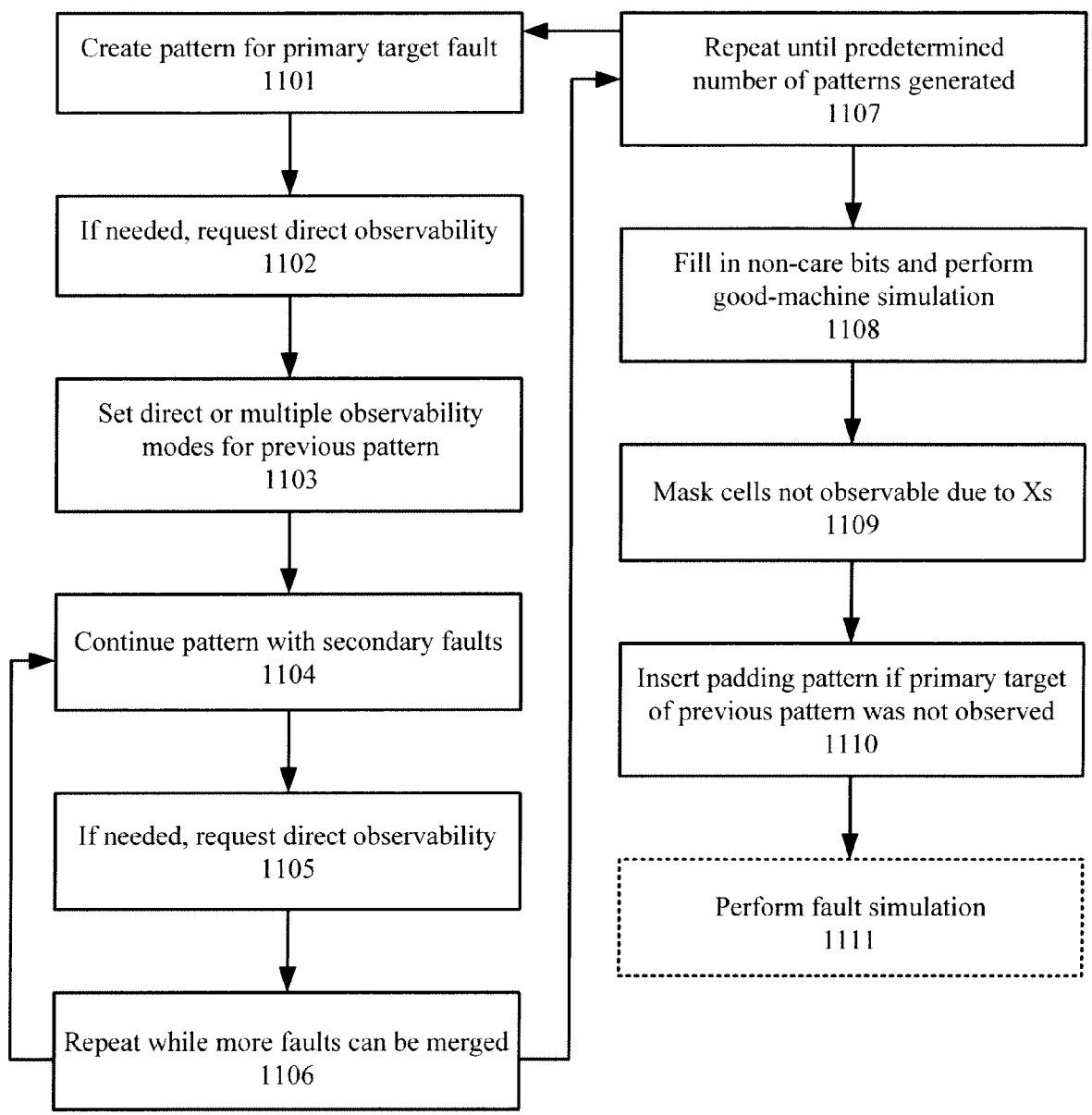
FIG. 11 illustrates an exemplary ATPG flow that can take advantage of the X-chains.

Placing most X-cells in X-chains can provide multiple benefits for ATPG. FIG. 11 illustrates an exemplary ATPG flow 1100 that can take advantage of the X-chains. During ATPG flow 1100, the test generator first creates a pattern in step 1101 to detect a primary target fault. Because the control of X-tolerant unloads is shared with the overlapped scan load of the next pattern, dependencies between adjacent patterns must be resolved before secondary target faults can be considered. Therefore, care bits for needed direct observability modes for faults detected in the previous pattern are set in step 1102, if needed. Advantageously, because the X-density outside of the X-chains is very low, X-chains decrease the need for direct observability of non-X-chains. When the control of X-tolerant unloads is output along with the overlapped scan load of the next pattern (see, e.g. FIG. 1, control 108), dependencies between adjacent patterns must be resolved before secondary target faults are considered. Therefore, care bits for needed direct observability modes for faults detected in the previous pattern are now set, if possible. If the direct observation mode needed for a targeted fault cannot be satisfied, then an attempt is made in step 1103 to set one of the multiple observation modes if it results in fault detection. Step 1104 performs secondary fault test generation to complete the pattern creation.

If, for a given shift cycle M, the first observation of a target fault is in a scan cell which is part of an X-chain, then selection of further secondary target faults can be narrowed by observing that cycle M will require a direct observability mode (step 1105) in which only few other chains can be observed. Further secondary targets must be observable in one of those few chains. Conversely, if, for a shift cycle P, the first observation of a target fault is in a scan cell not part of an X-chain, then selection of further secondary target faults can be narrowed by eliminating all X-chains for cycle P because cycle P is likely to not require a direct observation mode. Thus, no X-chains will be observable in cycle P. Step 1106 returns to step 1104 while more faults can be merged in the pattern. Thus, X-chains allow improved secondary target fault selection by increasing the odds that the fault will actually be observed and get detection credit (steps 1104-1106).

Step 1107 repeats steps 1101-1106 until a predetermined number of patterns have been generated. In one embodiment, 32 patterns can be generated. After the predetermined number of patterns have been generated, step 1108 can fill in non-care bits and perform a "good-machine" (i.e. a defect-free machine) simulation on the current pattern using the direct observation modes created for the next pattern. Notably, the full observability and multiple observability modes have only a few Xs because X-chains are not observed in these modes. Therefore, fewer cells are masked by Xs in step 1109, which results in higher overall observabiity.

For enhanced performance, the 32 patterns can be simulated in parallel, thereby exploiting parallel operations on computer words. However, this implies that the test generator must create 32 patterns before any pattern is simulated and X values can be determined. After setting care bits for the primary target fault of pattern n+1, the test generator must satisfy needed direct observability modes for pattern n. However, pattern n has not been simulated yet, so its X values and needed direct observability are not yet known. Without the benefit of X-chains, the test generator can only rely on historical data, i.e. a scan cell that has "often" required a direct observation mode is likely to require it again, so that cell is marked as needing direct observability. There is a chance that the cell would be observable in the full observation mode, in which case care bits have been wasted to select a direct observability mode, and observability has been unnecessarily restricted. Conversely, if the test generator does not mark a cell as needing direct observability, there is a chance that it will be X-masked and fault detection is lost. Advantageously, X-chains can substantially eliminate this double risk, because cells in X-chains always require direct observability, and cells not in X-chains rarely require this type of observability (step 1105).

Note that secondary target faults with an unobservable detection cell are retargeted by future patterns. If a primary target fault which requires direct observation cannot be observed due to competition with care bits of the primary target fault of the next pattern, then step 1110 can insert a padding pattern between the two patterns to avoid test coverage loss. This padding pattern targets no faults and has no observation. Therefore, this padding pattern avoids competition for care bits with both the preceding and following pattern. However, padding patterns may reduce effective compression by increasing total pattern count. Efficient usage of X-chains can advantageously decrease the number of added padding patterns because direct observation modes are mostly limited to X-chains, which represent a small percentage of total chains (step 1110). At this point, the ATPG flow 1100 is complete and step 1111 can perform fault simulation.

The following information provides the context for the empirical results using X-chains in 17 industrial designs. The 17 industrial designs ranged from 0.6 million to 6 million gates. All compression results were compared with optimized scan ATPG with dynamic compaction, for stuck-at fault model. The designs were configured with 60× the number of internal scan chains vs. scan to obtain data and cycles compression around 35× and allow for a 70% pattern inflation over scan. Each design was run multiple times through the DFT-ATPG flow, e.g. a first time for regular scan (no compression), a second time for fully X-tolerant compression with scan cells organized in scan chain strictly by layout optimizations, and a third time using fully X-tolerant compression with X-chains. Notably, for each of the designs, the three runs obtained the same test coverage, i.e. within 0.1% random variations (that is, no method obtained systematically higher coverage than another). Advantageously, the CPU time was not significantly affected by the added operations to create and use X-chains.

Figure 12:
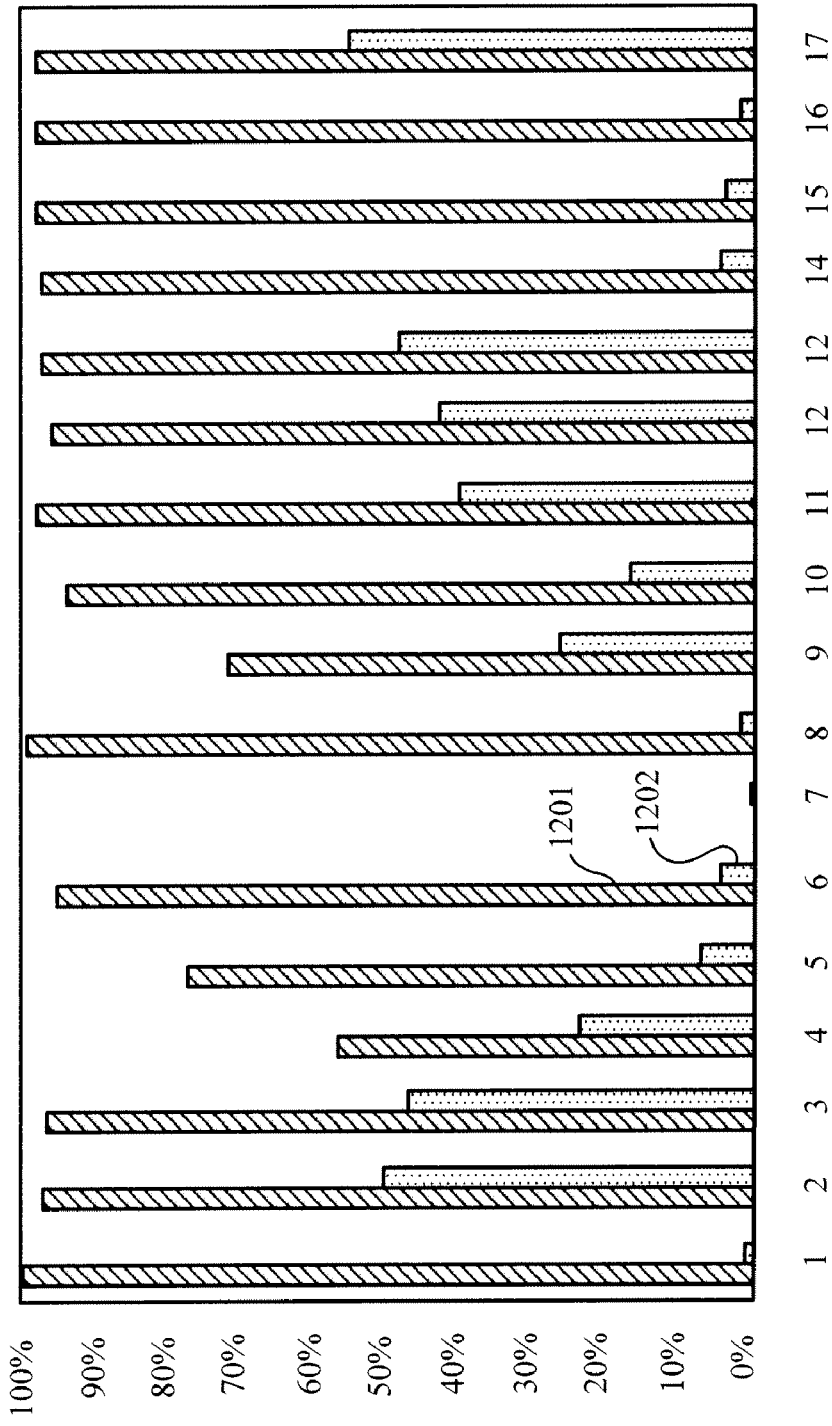
FIG. 12 illustrates a direct observation mode usage chart indicating the effect of X-cells and X-chains on compressed patterns.

As illustrated by the simple, random-patterns based analysis of FIGS. 5 and 8, the number and nature of the X-cells and X-chains in the 17 designs varies widely. The deterministic patterns generated in the full ATPG flow are much more complex, including justification and sensitization of faults, and multiple simultaneous clocks. The effect of X-cells and X-chains on compressed patterns is shown in a direct observation mode usage chart 1200, which is illustrated in FIG. 12. The bars 1201 show the percentage of all shift cycles that used direct observation mode, and the bars 1202 show the percentage of shift cycles that used direction observation modes and selected at least one X-chain.

As indicated by chart 1200, direct observation mode shifts are predominantly used for X-chains, as bars 1201 are mostly in the 90% (except design 7 which has no X-chains). In contrast, bars 1202 show much wider variations. For example, designs 1, 7, 8, 16 have no or very few X-cells (see FIG. 5) and, correspondingly, very few direct observation cycles (see FIG. 12). However, designs 11 and 12 also have very few X-cells (see FIG. 5) but a high percentage of direct observation cycles (see FIG. 12), which suggests that a large number of faults are detected in the X-cells. Indeed, the average X-probabiity of X-chains is quite low for designs 11 and 12 (see FIG. 8). Therefore, X-cells can relatively often capture non-X values.

Design-specific peculiarities also appear at the high-end of direct observation usage. For example, designs 6, 13, 15, 17 have the highest percentages of X-cells (see FIG. 5), but designs 6 and 15 only have relatively few direct observation cycles (see FIG. 12), whereas designs 13 and 17 have some of the highest percentage of direct observation cycles. Ultimately, the profile of X-cells in a design affects ATPG results, i.e. the compression achieved.

Data compression can be calculated as follows. If npatsscan is the number of uncompressed scan patterns and nscancells is the number of scan cells in the design, then the scan data volume $Data_{scan}$ can be computed by:

$$Data_{scan}=(npats_{scan})nscancells$$

If $nchains_{int}$ is the number of internal scan chains, e.g. see internal scan chains 104 (FIG. 1) and $nchains_{ext}$ is the number of external scan chains being directly connected to scan input pins 101A, control 101B, unload_enable 102, and scan output pins 107 (FIG. 1), then K, which is the ratio between the number of internal and external chains, can be computed by:

$$K=nchains_{int}/nchains_{ext}$$

In one exemplary embodiment and used for the above-described 17 designs, K=60.

In the compressed mode, the internal chains are of near perfectly equal lengths. Therefore, the compressed data volume can be computed by:

$$Data_{comp}=npats_{comp}nshifts_{comp}nchains_{ext}$$

wherein $nshifts_{comp}$ is the number of shifts per compressed pattern and $npats_{comps}$ is the number of compressed patterns. Becauset $nscancells=nshifts_{comp}nchains_{int}$, then:

$$Data_{comp}=(npats_{comp})nscancells/K$$

And data compression $Compr_{data}$ can be computed by:

$$Compr_{data}=Data_{scan}/Data_{comp}=K\,npats_{scan}/npats_{comp}$$

Figure 13:
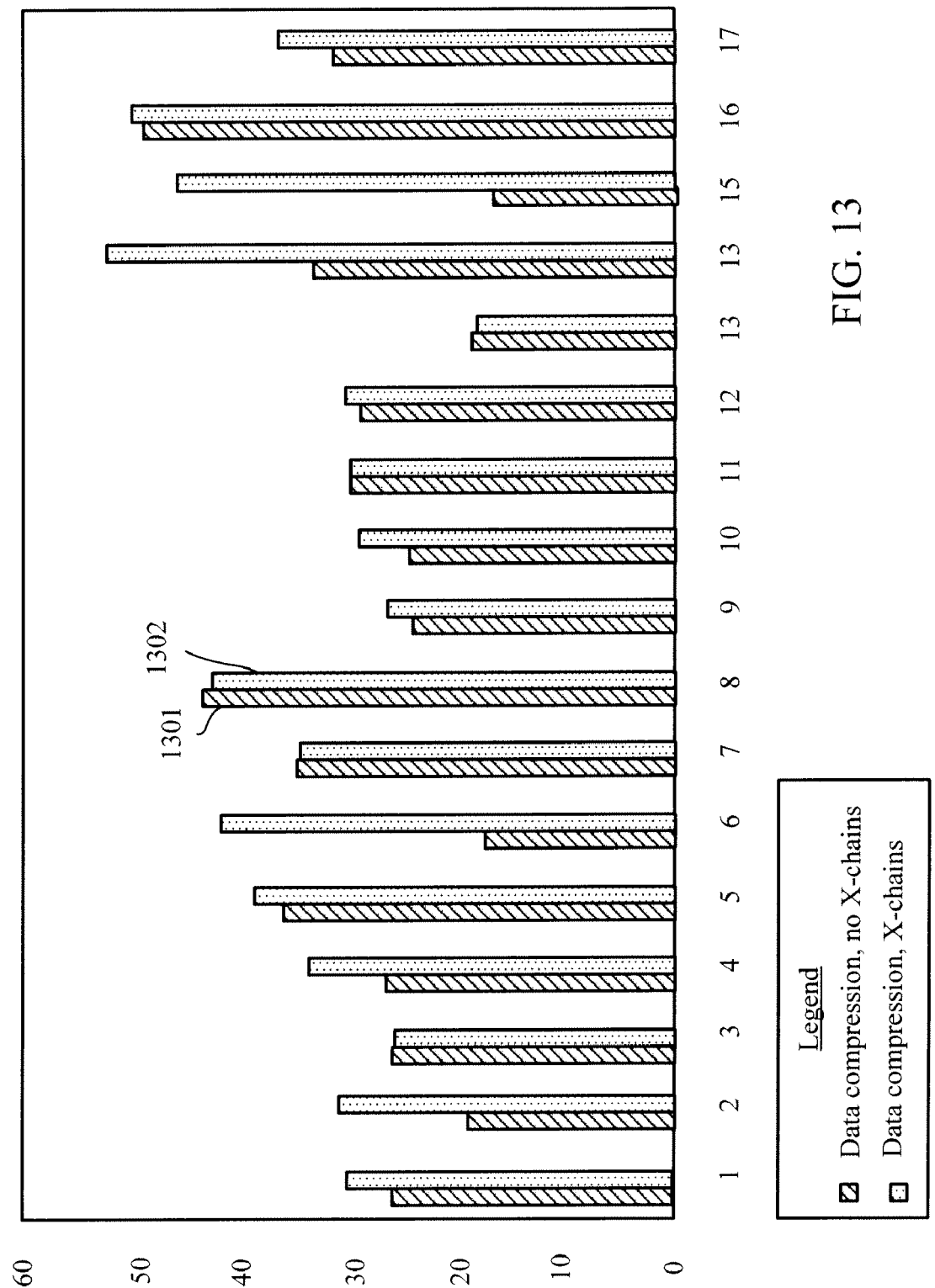
FIG. 13 illustrates a chart that shows the resulting data compression for the 17 industrial designs with and without X-chains.

FIG. 13 illustrates a chart 1300 that shows the resulting data compression for the 17 industrial designs with and without X-chains. Compression with X-chains (represented by bars 1302) is, for many designs, significantly higher than compression with no X-chains (represented by bars 1301), and is about the same (within small random variations) for some other designs. Overall, the average compression for all designs is 29 with no X-chains and increases to 35 with X-chains. Compression is directly related to pattern inflation Infl versus scan as follows:

$$Infl=npats_{comp}/npats_{scan}$$

Therefore, $$Compr_{data}=K/Infl$$

wherein K was set to 60 for all designs.

FIG. 13 can also be interpreted as representing the inverse of pattern inflation.

Cycle compression is calculated as follows:

$$Cycles_{scan}=npats_{scan}nshifts_{scan}, \text{ and}$$

$$Cycles_{comp}=npats_{comp}nshifts_{comp}$$

For consistency, every compressed design was configured to use the same number of external scan pins as the non-compressed scan version of the same design. Compressed mode scan chains are near perfectly balanced. Therefore, $$nshifts_{comp}=nscancells/nchains_{int}=nscancells/Kn\text{-}chains_{ext}$$

Because uncompressed scan mode chains are typically not as well balanced, $$nshifts_{scan}>nscancells/nchains_{ext}$$

Therefore, cycles compression can be computed by:

$$Compr_{cycles}=Cycles_{scan}/Cycles_{comp}>K/Infl=Compr_{data}$$

Note that due to better balancing of scan chain lengths in compressed mode than in scan mode, cycles compression is typically higher than data compression.

Both data and cycles compression are inversely proportional to Infl, which is influenced by several factors independent of X-chains, most notably by the restricted ability to merge multiple secondary faults per pattern due to dependencies introduced by the load decompressor, and the effect of dynamic X-cells, such as masking of inter-clock domain scan cells in patterns pulsing multiple clocks. These effects notwithstanding, the small subset of cells placed in X-chains have been shown to have a significant impact on $npats_{comp}$ and, thus, Infl and compression.

The nature of the X-cells in the design, as represented by FIGS. 5, 8, and 12, correlates remarkably well with ATPG results in FIG. 13. Notably, designs generally fall into one of three categories. In a first category, designs 2, 4, 6, 14, 15 show significant improvement when using X-chains vs. no X-chains (FIG. 13). Design 2 has good isolation between X-chains and non-X-chains (FIG. 8) and high usage of direct observation modes (FIG. 12). Designs 4, 6, 14, 15 have less good isolation but also less need for direct observation modes.

In a second category, designs 1, 3, 9, 10, 11, 12 show little or no improvement using X-chains vs. no X-chains (FIG. 13). They have generally few X-cells (FIG. 5). Designs 3, 9, 11, 12 have mediocre isolation between X-chains and non-X-chains (FIG. 8). Designs 1 and 10 have low usage of direct observation modes (FIG. 12). Designs 13 and 17 also have little or no improvement using X-chains vs. no X-chains (FIG. 13). They have many X-cells (FIG. 5) that are often needed for fault detection (FIG. 12), but are poorly isolated between X-chains and non-X-chains (FIG. 8).

In a third category, designs 5, 7, 8, 16 have already achieved high compression (35× or better) without X-chains (FIG. 13), thereby leaving little opportunity for improvement. Therefore, the X-chains results on these designs are about the same as without X-chains.

Figure 14:
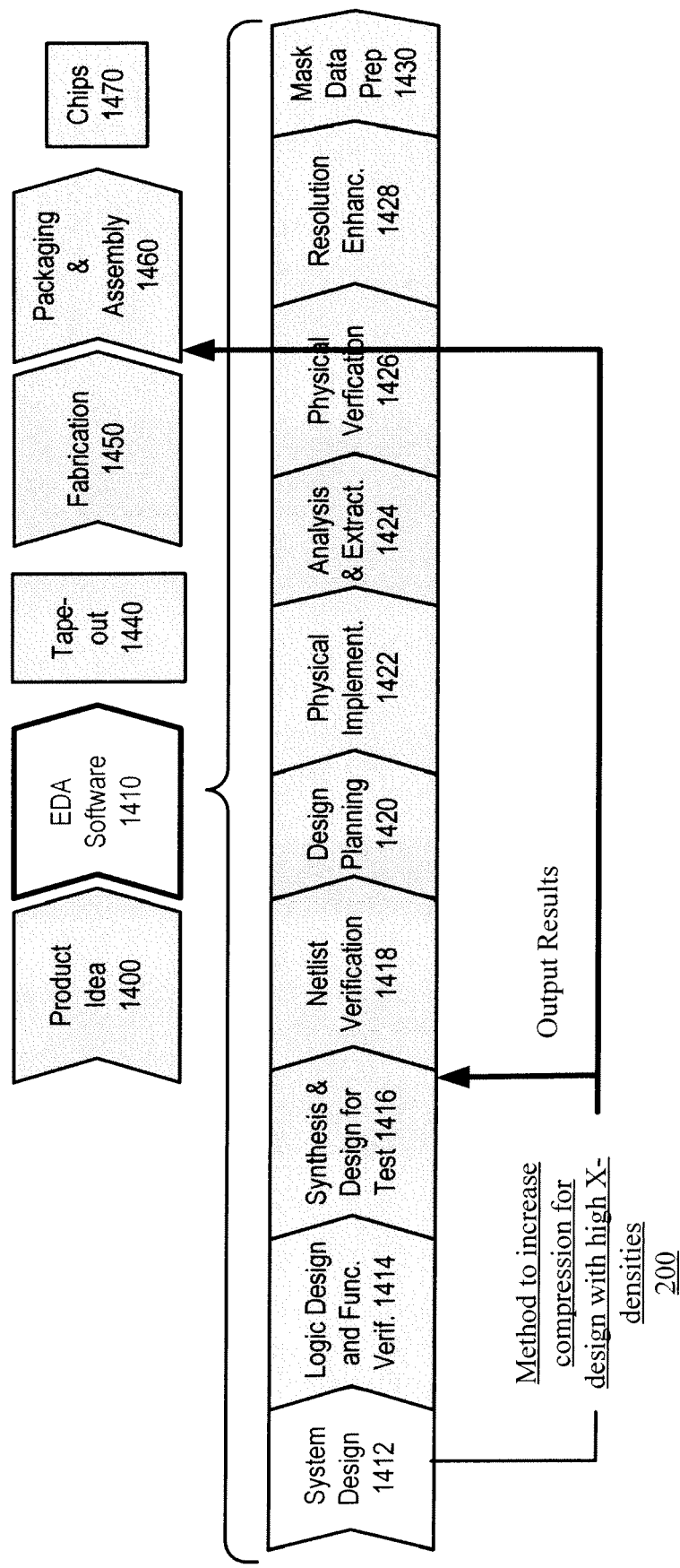
FIG. 14 shows a simplified representation of an exemplary digital ASIC design flow.

FIG. 14 shows a simplified representation of an exemplary digital ASIC design flow. At a high level, the process starts with the product idea (step 1400) and is realized in an EDA software design process (step 1410). When the design is finalized, it can be taped-out (event 1440). After tape out, the fabrication process (step 1450) and packaging and assembly processes (step 1460) occur resulting, ultimately, in finished chips (result 1470).

The EDA software design process (step 1410) is actually composed of a number of steps 1412-1430, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components steps of the EDA software design process (step 1410) will now be provided:

System design (step 1412): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect, Saber, System Studio, DFT-Compiler, TetraMAX ATPG, and DesignWare® products. In one embodiment, the above-described method 200 to increase compression for an IC design with high X-densities can be performed in step 1412 by DFT-Compiler The output results of the TetraMAX ATPG tool, modified as described to exploit X-chains, can be used on the final netlist, after step 1416. Additionally, the output results of the TetraMAX tool can include test vectors usable after step 1450.

Logic design and functional verification (step 1414): At this stage, the VHDL or Verilog code for modules in the system is written and the design is checked for functional accuracy. More specifically, does the design as checked to ensure that produces the correct outputs. Exemplary EDA software products from Synopsys, Inc. that can be used at this step include VCS, VERA, DesignWare®, Magellan, Formality, ESP and LEDA products.

Synthesis and design for test (step 1416): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Power Compiler, Tetramax, and DesignWare® products.

Netlist verification (step 1418): At this step, the netlist is checked for compliance with timing constraints and for correspondence with the VHDL/Verilog source code. Exemplary EDA software products from Synopsys, Inc. that can be used at this step include Formality, PrimeTime, and VCS products.

Design planning (step 1420): Here, an overall floorplan for the chip is constructed and analyzed for timing and top-level routing. Exemplary EDA software products from Synopsys, Inc. that can be used at this step include Astro and IC Compiler products.

Physical implementation (step 1422): The placement (positioning of circuit elements) and routing (connection of the same) occurs at this step. Exemplary EDA software products from Synopsys, Inc. that can be used at this step include the Astro and IC Compiler products.

Analysis and extraction (step 1424): At this step, the circuit function is verified at a transistor level, this in turn permits what-if refinement. Exemplary EDA software products from Synopsys, Inc. that can be used at this step include AstroRail, PrimeRail, Primetime, and Star RC/XT products.

Physical verification (step 1426): At this step, various checking functions are performed to ensure correctness for: manufacturing, electrical issues, lithographic issues, and circuitry. Exemplary EDA software products from Synopsys, Inc. that can be used at this step include the Hercules product.

Resolution enhancement (step 1428): This step involves geometric manipulations of the layout to improve manufacturability of the design. Exemplary EDA software products from Synopsys, Inc. that can be used at this step include Proteus, ProteusAF, and PSMGen products.

Mask data preparation (step 1450): This step provides the "tape-out" data for production of masks for lithographic use to produce finished chips. Exemplary EDA software products from Synopsys, Inc. that can be used at this step include the CATS(R) family of products.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent. For example, an apparatus of the invention can be implemented in a computer program product (e.g. instructions) tangibly embodied in a machine-readable storage device (e.g. a computer-readable medium) for execution by a programmable processor (e.g. a computer). Thus, the above-described methods of the invention can be performed by a programmable processor executing a program of instructions to perform functions of the invention by operating on input data and generating output data.

Moreover, note that although combinational scan compression is described in FIGS. 1 and 9, for example, other embodiments of the present invention can be implemented using other scan compression architectures. In these embodiments, the architecture may include a combined unload selector/compressor or just a compressor. Note that the corresponding configuration and observation modes may vary based on the chosen architecture. For example, in one embodiment, a plurality of observation modes may be provided; however, in each observation mode, no more than one X-chain can be observed. This rule still allows the X-chains to be observed differently than the non-X-chains, thereby allowing different compressions for X-chains and non-X-chains. Accordingly, it is intended that the scope of the invention be defined by the following Claims and their equivalents.

The invention claimed is:

1. A method to increase scan compression during testing of a design for an integrated circuit, the method comprising:
   identifying X-cells of the design, wherein the X-cells are scan cells of the design that have at least a predetermined likelihood of capturing an unknown (X) value;
   forming at least one X-chain, wherein each X-chain is a scan chain including only X-cells;
   providing configuration and observation modes for at least one of an unload selector and an unload compressor, wherein the configuration and observation modes provide a first compression for non-X-chains that is greater than a second compression provided for X-chains; and
   using a computer, modifying an automatic test pattern generation (ATPG) based on at least the configuration and observation modes for at least one of the unload selector and the unload compressor.

2. The method of claim 1, wherein providing the configuration and observation modes includes:
   using a combinational implementation for the unload selector and the unload compressor; and
   using only a direct observation mode to observe each X-chain and using one of the direct observation mode, a full observability mode, and a multiple observability mode to observe each non-X-chain.

3. The method of claim 2, wherein using the combinational implementation for the unload selector and the unload compressor includes:
   providing an AND-based unload selector;
   within the AND-based unload selector, providing a single AND gate to receive an output of an X-chain; and
   further within the AND-based unload selector, providing first and second AND gates to each receive an output of a non-X-chain.

4. The method of claim 3, wherein using the combinational implementation for the unload selector and the unload compressor includes:

providing an XOR-based unload compressor;

within the XOR-based unload compressor, providing a single XOR gate to receive an output of the single AND gate; and further within the XOR-based unload compressor, providing a first XOR gate to receive an output of the first AND gate, and providing second and third XOR gates to receive an output of the second AND gate.

5. The method of claim 1, wherein identifying X-cells includes:

designating latches and flip-flops of the design as scanable;

performing clock, set, and reset controllability and designating any latches and flip-flops that fail as non-scan;

setting constrained primary inputs of the design to their constrained values, set clocks to off, and set scan enable to capture non-shift values;

setting constant-value state elements of the design to their predetermined binary value;

setting other primary inputs, non-constant latches, and non-constant flip-flops to random binary values;

setting other state elements of the design to X;

simulating a predetermined number of random scan patterns to determine a frequency that data input of a latch/flip-flop is at X; and designating any latch/flip-flop whose data input is X with a frequency exceeding a set X-threshold as an X-cell.

6. The method of claim 5, wherein the set X-threshold is 25%.

7. The method of claim 1, wherein forming at least one X-chain includes:

placing designated X-cells into one chain;

sorting the designated X-cells based on X-probability;

retaining a predetermined top percentage of the designated X-cells based on the sorting;

subdividing the one chain into smaller chains and designating each such smaller chain an X-chain.

8. The method of claim 7, wherein the predetermined top percentage is 5%.

9. The method of claim 7, wherein sorting the designated X-cells includes sorting the designated X-cells based on location after sorting based on X-probability.

10. The method of claim 7, wherein subdividing is performed until each X-chain has a length not exceeding a longest non-X-chain.

11. The method of claim 1, wherein providing the configuration and observation modes for at least one of the unload selector and the unload compressor includes:

designing the unload compressor based on Steiner Triple Systems, wherein a set S of Q elements and a set T of triples of elements from S, such that every pair from S appears in exactly one triple of T; and modifying the Steiner Triple Systems so that only non-X-chains are considered for the set T.

12. The method of claim 1, wherein providing the configuration and observation modes for at least one of the unload selector and the unload compressor includes designing the unload selector after designing the unload compressor.

13. The method of claim 12, wherein designing the unload selector includes ensuring that each chain can be uniquely observed in at least one direct observation mode and a total number of direct observation modes is as small as possible.

14. The method of claim 1, wherein modifying the ATPG includes:

when, for a shift cycle M, a first observation of a target fault is in a scan cell which is part of an X-chain, then narrowing selection of secondary target faults because shift cycle M requires a direct observability mode for the X-chains; and when, for a shift cycle P, a first observation of a target fault is in a scan cell not part of an X-chain, then narrowing selection of secondary target faults by eliminating all X-chains for shift cycle P because cycle P is likely to not require a direct observation mode.

15. The method of claim 1, wherein modifying the ATPG includes:

resolving dependencies between adjacent patterns before considering secondary target faults.

16. The method of claim 15, wherein modifying the ATPG further includes:

setting care bits for needed direct observability modes for faults detected in a previous pattern.

* * * * *